US008107582B2

(12) United States Patent
Wang

(10) Patent No.: US 8,107,582 B2
(45) Date of Patent: Jan. 31, 2012

(54) METHODS AND APPARATUS FOR DIGITAL CLOCK RECOVERY

(75) Inventor: Weifeng Wang, Shanghai (CN)

(73) Assignee: Beken Corporation, Shanghai (CN)

( * ) Notice: Subject to any disclaimer, the term of this patent is extended or adjusted under 35 U.S.C. 154(b) by 650 days.

(21) Appl. No.: 12/256,397

(22) Filed: Oct. 22, 2008

(65) Prior Publication Data

US 2010/0040185 A1  Feb. 18, 2010

(30) Foreign Application Priority Data

Aug. 12, 2008 (CN) .......................... 2008 1 0043698

(51) Int. Cl.
*H03D 3/24* (2006.01)
(52) U.S. Cl. ........ 375/376; 375/324; 375/327; 375/371; 375/373; 375/375; 331/16; 331/23; 327/147; 327/552
(58) Field of Classification Search .......... 375/135–136, 375/215, 226, 293–294, 324, 327, 362, 371, 375/373, 375, 376, 227, 299
See application file for complete search history.

(56) References Cited

U.S. PATENT DOCUMENTS

| | | | | |
|---|---|---|---|---|
| 6,246,885 | B1* | 6/2001 | Black et al. | 455/553.1 |
| 7,149,914 | B1* | 12/2006 | Asaduzzaman et al. | 713/500 |
| 7,190,755 | B1* | 3/2007 | Sung et al. | 375/376 |
| 7,312,645 | B1* | 12/2007 | Brunn | 327/147 |
| 7,573,955 | B2* | 8/2009 | Gazsi | 375/327 |
| 2006/0091964 | A1* | 5/2006 | Wong et al. | 331/16 |
| 2007/0132490 | A1* | 6/2007 | Robinson et al. | 327/156 |
| 2007/0176693 | A1* | 8/2007 | Lin | 331/16 |
| 2008/0272951 | A1* | 11/2008 | Li Puma et al. | 341/158 |

FOREIGN PATENT DOCUMENTS

| | | |
|---|---|---|
| CN | 1855726 A | 11/2006 |
| EP | 0793348 A1 | 9/1997 |
| WO | 2008078452 A1 | 7/2008 |

OTHER PUBLICATIONS

"Infinite impulse response," Wikipedia, http://en.wikipedia.org/wiki/Iir_filter [Last Accessed May 26, 2010], 4 pages.
"Phase Frequency Detector," Wikipedia, http://en.wikipedia.org/wiki/Phase_Frequency_Detector [Last Accessed May 26, 2010], 1 page.
"Phase-locked loop," Wikipedia, http://en.wikipedia.org/wiki/Phase-locked_loop [Last Accessed May 26, 2010], 12 pages. "Voltage-controlled oscillator," Wikipedia, http://en.wikipedia.org/wiki/Voltage-controlled_oscillator [Last Accessed May 26, 2010], 2 pages.
Tekin, Ahmet et al., "A Low-Power FSK Modulator/Demodulator for an MICS Band Transceiver," IEEE, 2006, 4 pages.
Sun, Yanbing, "First Office Action," CN Application No. 200810043698.X, State Intellectual Property Office, Mar. 23, 2011, China.

* cited by examiner

*Primary Examiner* — Hirdepal Singh
(74) *Attorney, Agent, or Firm* — Perkins Coie LLP; Aaron Wininger

(57) ABSTRACT

A method and apparatus for clock recovery in synchronous digital systems. The apparatus includes a phase frequency detector, a loop filter, a compressor, and a clock generator. The phase frequency detector generates a phase error signal based on a difference between an input clock signal and an output clock signal. The loop filter multiplies the phase error signal and filters the multiplied phase error signal. The compressor divides the loop filter output. Based on the compressor output, the clock generator generates an output clock signal is provided as a feedback signal to the phase error detector. The apparatus may also include a glitch cleaner for deglitching the input clock signal.

10 Claims, 4 Drawing Sheets

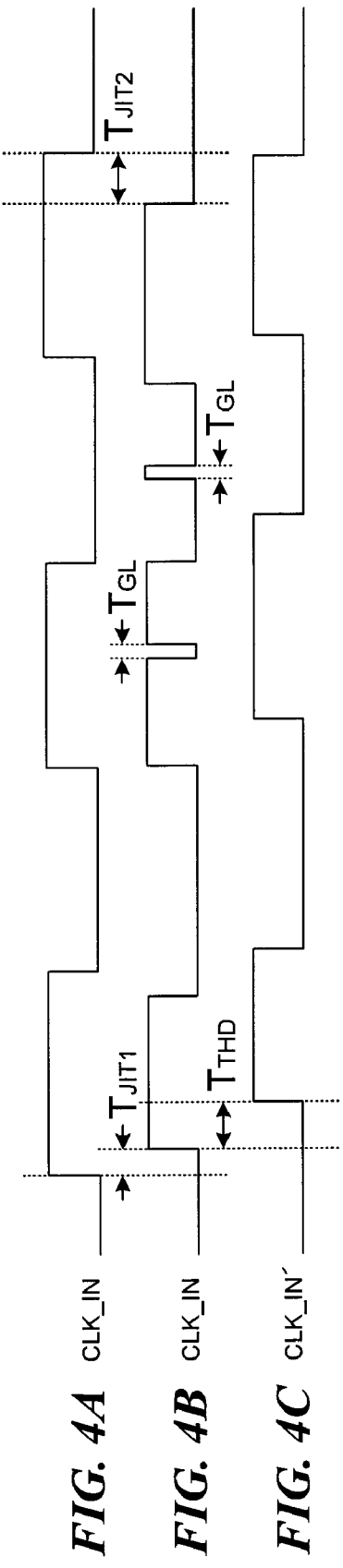

METHODS AND APPARATUS FOR DIGITAL CLOCK RECOVERY

CROSS-REFERENCE TO RELATED APPLICATION

This application claims priority to Chinese Patent Application No. 200810043698.X filed Aug. 12, 2008, the disclosure of which is hereby incorporated by reference in its entirety.

TECHNICAL FIELD

The present disclosure is related to methods and apparatus for clock recovery in synchronous digital systems.

BACKGROUND

Clock recovery is often employed in synchronous digital systems. For example, clock recovery circuits and methods may be employed where data and clock signals are multiplexed through shared channels, where clock signals are transmitted over noisy channels, where data is transmitted without an accompanying clock signal, and/or the like. In these and other applications, clock recovery circuits and methods may be employed, for example, to recover bit clock signals, to recover frame synchronization signals, or to generate local oscillator (LO) signals.

Non-idealities such as channel noise, channel delays, electromagnetic interference, circuit delays, and/or the like, may adversely affect the recovery of clock signals. These and other non-idealities may cause glitches, jitter, noise, and/or the like, to be incorporated into the recovered clock signals and may decrease system performance. For example, non-idealities may increase the bit error rate (BER) in digital communications, may make it difficult for clock recovery circuit to lock onto a received clock, and/or the like. In certain applications, it may be beneficial to reduce the detrimental effects of these non-idealities.

BRIEF DESCRIPTION OF THE DRAWINGS

FIGS. 4A-4C are embodiments of waveforms illustrating the operation of the glitch cleaner of FIG. 3 in accordance with an embodiment of the invention.

DETAILED DESCRIPTION

The following disclosure describes several embodiments of methods and apparatus for clock recovery in synchronous digital systems. Several details describing well-known structures or processes often associated with digital systems are not set forth in the following description for purposes of brevity and clarity. Also, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 1-4.

Figure 1:
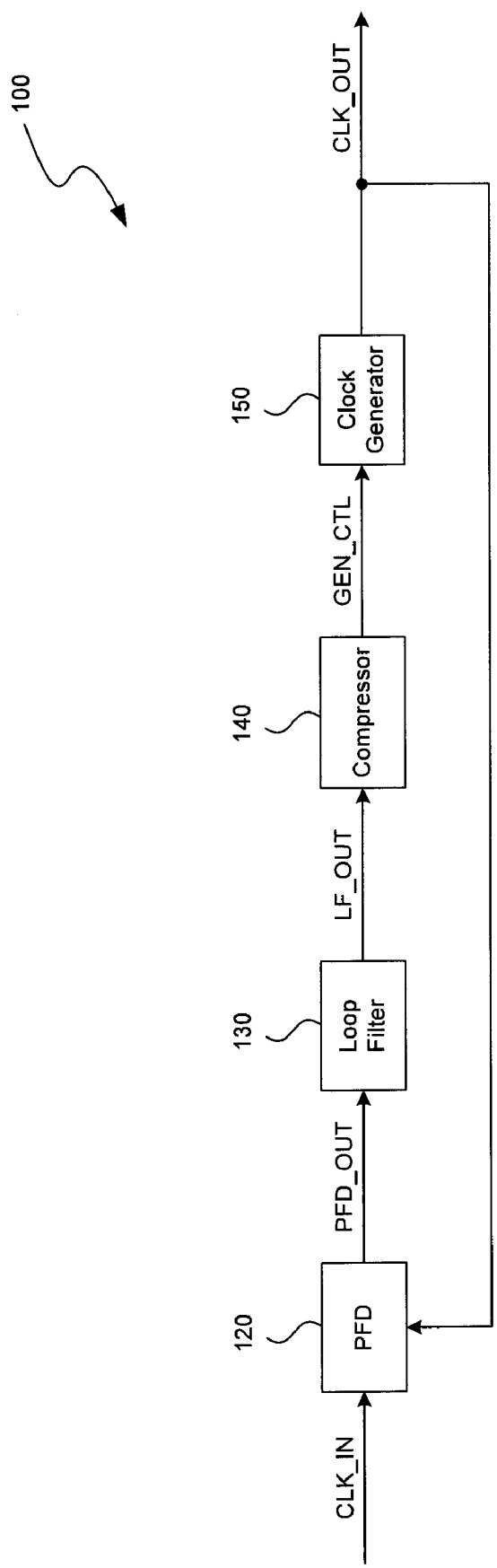
FIG. 1 is a block diagram of a clock recovery system in accordance with an embodiment of the invention.

FIG. 1 is a block diagram of clock recovery system 100. As illustrated, system 100 includes phase frequency detector (PFD) 120, loop filter 130, compressor 140, and clock generator 150. In one embodiment, system 100 is a phase lock loop (PLL) based clock recovery circuit that is configured to generate clock signal CLK_OUT from input clock signal CLK_IN. An application specific integrated circuit (ASIC), a field programmable gate array (FPGA), discrete components, and/or the like, may be employed in such a circuit. Such components may also include analog circuitry, digital circuitry, and/or a mix of analog and digital circuitry. However, for other embodiments, system 100 illustrates a logical flow diagram for recovering a clock signal by employing a digital signal processor (DSP), a microprocessor, a microcontroller, an ASIC, other digital logic, and/or the like.

System 100 may be employed by cellular phones, wireless phones, wireless network cards, wireless radios, and/or other suitable wireless communication devices to recover a clock signal that has been transmitted through a communications channel. In addition, system 100 may be employed to recover a clock signal that has been stored in a storage medium or may be employed to generate and/or improve clock signal from any other source. System 100 may also be employed in, or by, a wide variety of devices and systems to generate and/or improve the quality of clock signals. For example, wireless communications devices, wired communications devices, interface systems, computing devices, embedded systems, and/or other electronic devices or circuits may employ system 100. In one embodiment, system 100 is employed in a software radio to recover a clock signal that has been included in a wireless communications signal.

System 100 is further configured to recover and/or generate clock signal CLK_OUT based on scaling the phase error signal (e.g., multiplying the phase error signal with a constant) prior to, or during, filtration of the phase error signal. For example, scaling the phase error signal may decrease the effects of input clock signal CLK_IN noise on the operation of system 100 and on the device or circuit employing system 100. When employed in a digital PLL system, scaling of the phase error signal may especially increase the system's ability to detect and thus compensate for noise. In particular, the scaling may decrease the effect of rounding errors, fixed point arithmetic errors, and/or the like, which are sometimes inherent in digitally performed calculations. In effect, this may increase the tracking resolution and stability of such a system.

In one embodiment, input clock signal CLK_IN is representative of a received clock signal and may be provided to PFD 120 from a demodulator, from an analog to digital converter (ADC), and/or the like (not shown). These and other devices may be configured to provide input clock signal CLK_IN from a wireless communications signal. In other embodiments, input clock signal CLK_IN may be provided by a local oscillator. For example, a crystal oscillator, a LC circuit, an RC circuit, and/or the like, may provide input clock signal CLK_IN to system 100. However, input clock signal CLK_IN may be provided from any suitable source.

As shown, PFD 120 is configured to receive input clock signal CLK_IN, to receive output clock signal CLK_OUT, and to provide phase error signal PFD_OUT. PFD 120 may be configured to provide phase error signal PFD_OUT to represent a difference between input clock signal CLK_IN and output clock signal CLK_OUT and to operate as part of a closed feedback loop to drive the frequency and/or phase of output clock signal CLK_OUT to match that of input clock signal CLK_IN.

PFD 120 may provide a value on phase error signal PFD_OUT that is proportional to the phase difference between input clock signal CLK_IN and output clock signal CLK_OUT. In another embodiment, PFD 120 may provide a value on phase error signal PFD_OUT that is proportional to the frequency difference between input clock signal CLK_IN and output clock signal CLK_OUT.

Loop filter 130 is configured to receive phase error signal PFD_OUT from PFD 120 and to generate filtered signal LF_OUT. Loop filter 130 is also configured to scale phase error signal PFD_OUT prior to filtration. For example, loop filter 130 may be configured to multiply phase error signal PFD_OUT by a scaling factor prior to filtration. In one embodiment, a scaling factor of 32 may be employed. However, any other suitable number may be employed. Likewise, the gain of loop filter 130 may provide a non-unity gain such that the phase error signal is scaled during filtration instead of being scaled prior to filtration.

Loop filter 130 may include a low-pass filter that is configured to reject high frequency signals and to allow low frequency signals to pass through as filtered signal LF_OUT. In one embodiment, loop filter 130 includes an infinite impulse response (IIR) filter such as a Chebyshev filter, a Bessel filter, a Butterworth filter, an elliptic filter, and/or the like. However, any other suitable filters may be employed. For example, a RC filter, an LC filter, a finite impulse response filter, a SAW filter, and/or the like, may be employed instead of an IIR filter.

Compressor 140 is configured to receive filtered signal LF_OUT from loop filter 130 and to provide clock generator control signal GEN_CTL to clock generator 150. As illustrated, compressor 140 is further configured to scale filtered signal LF_OUT by a scaling factor prior to providing clock generator control signal GEN_CTL. In one embodiment, compressor 140 multiples filtered signal LF_OUT by a scaling factor that is the inverse of the loop filter scaling factor. In such an embodiment, loop filter 130 and compressor 140 provide a combined gain that is substantially equal to a unity gain.

In other embodiments, compressor 140 may divide filtered signal LF_OUT by a scaling factor that is the same as the loop filter scaling factor. Again, the combined gain of loop filter 130 and compressor 140 will then be substantially equal to a unity gain. However, compressor 140 may provide a scaling factor that is neither the same as, nor the inverse of, the scaling factor provided by loop filter 130 (e.g., to provide output clock signal CLK_OUT at a different frequency then the frequency of input clock signal CLK_IN). Compressor 140 may employ a multiplication operation, a divide operation, employ a shift register, and/or the like, to scale filtered signal LF_OUT.

Clock generator 150 is configured to receive clock generator control signal GEN_CTL and to provide output clock signal CLK_OUT. Output clock signal CLK_OUT may be provided as an output of system 100. It may additionally be provided, directly or indirectly, to PFD 120 as a feedback signal. If output clock signal CLK_OUT is provided to PFD 120 indirectly, a divider, a multiplier, and/or the like, may be included such that the frequency of output clock signal CLK_OUT is driven to a multiple or to a fraction of the frequency of input clock signal CLK_IN. Also, in one embodiment, clock generator 150 sets the frequency of output clock signal CLK_OUT based on a value of clock generator control signal GEN_CTL. Clock generator 150 may include a digital clock synthesizer, a voltage controlled oscillator, a current controlled oscillator, a crystal oscillator, a ring oscillator, a surface acoustic wave oscillator, a Colpitts oscillator, and/or the like.

Figure 2:
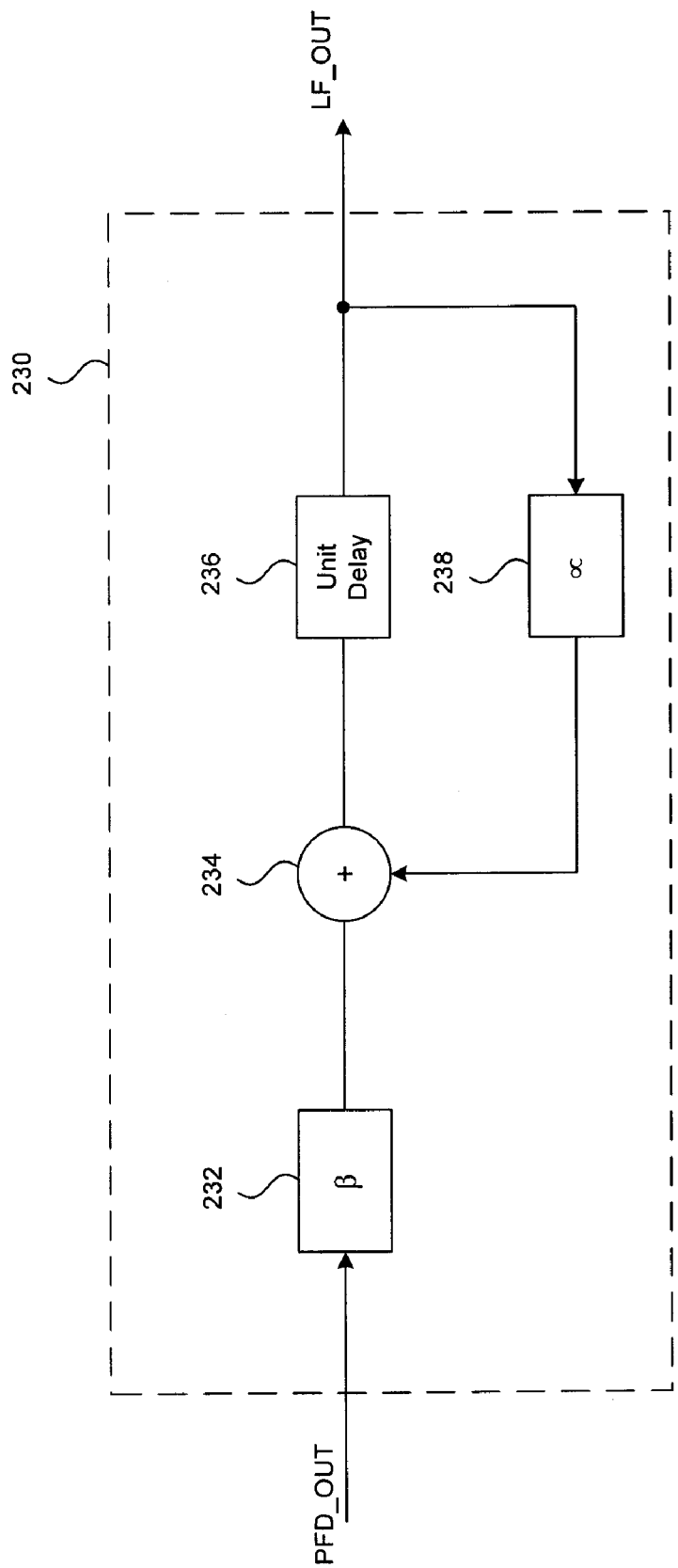
FIG. 2 is a block diagram of a loop filter useable in the clock recovery system of FIG. 1 in accordance with an embodiment of the invention.

FIG. 2 is a block diagram of loop filter 230. As illustrated, loop filter 230 includes multiplier block 232, summing block 234, unit delay block 236, and multiplier block 238. Loop filter 230 may be employed as an embodiment of loop filter 130 of FIG. 1.

As illustrated, loop filter 230 is a first order IIR filter that is configured to receive and filter phase error signal PFD_OUT to provide filtered signal LF_OUT. In one embodiment, loop filter 230 is implemented as a digital filter by executing code on a DSP. However, ASICs, FPGAs, discrete logic, and/or the like, may also be suitably employed to implement loop filter 230.

Multiplier blocks 232 and 238, respectively, are configured to multiply their inputs with coefficients β and α. Multiplier blocks 232 and 238 may employ hardware multipliers, an arithmetic logic unit (ALU), and/or the like.

Summing block 234 is configured to sum the outputs of the multiplier blocks 232 and 238 to provide an input to unit delay block 236. Summing block 234 may employ a hardware adder, an ALU, and/or the like.

Unit delay block 236 is configured to provide a unit delay between the output of summing block 234 and filtered signal LF_OUT. In one embodiment, unit delay block 236 provides a synchronous delay. Registers, memories, flip-flops, delay lines, and/or the like, may be suitably employed as part of unit delay block 236.

Loop filter 230 may be configured to have a transfer function in the frequency domain (Z domain) of:

$$\frac{\beta}{1-\alpha Z^{-1}},$$

and such that:

$$LF\_OUT = (PFD\_OUT * \beta) + (LF\_OUT * Z^{-1} * \alpha),$$

where β is a first coefficient and α is a second coefficient. In one embodiment, coefficient β is 0.64 and coefficient α is 0.875. For this example, coefficient β is based on a filter coefficient of 0.02 multiplied by a scaling factor of 32. However, in other embodiments, phase error signal PFD_OUT may be multiplied by a scaling factor before it is passed to loop filter 230. Likewise, β and α may each be any suitable positive constants. However, other suitable values may also be employed.

Figure 3:
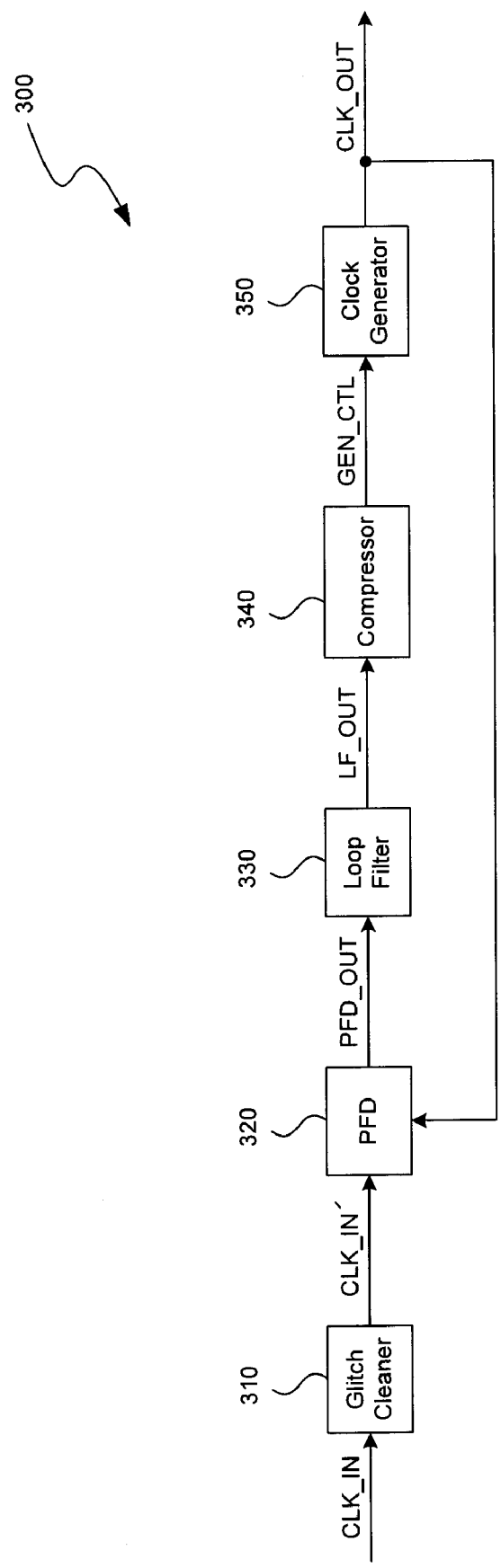
FIG. 3 is a block diagram of another clock recovery system in accordance with another embodiment of the invention.

FIG. 3 is a block diagram of clock recovery system 300. Certain aspects of clock recovery system 300 are similar to corresponding aspects of clock recovery system 100 of FIG. 1. However, other aspects are different. In particular, clock recovery system 300 includes glitch cleaner 310 which may be configured to deglitch input clock signal CLK_IN before providing deglitched clock signal CLK_IN' to phase frequency detector 320.

FIGS. 4A-4C are embodiments of waveforms illustrating the operation of glitch cleaner 310. FIG. 4A illustrates an embodiment of original clock signal CLK. FIG. 4B illustrates an embodiment of input clock signal CLK_IN. FIG. 4C illustrates an embodiment of deglitched clock signal CLK_IN'. Original clock signal CLK may be a clock signal to which a transmission is synchronized (e.g., the transmit clock of a wireless transmitter). Input clock signal CLK_IN may be derived from original clock signal CLK. For example, CLK_IN may be the clock signal that is generated after a wireless communications signal is received and/or demodulated.

Glitch cleaner 310 is configured to receive input clock signal CLK_IN and to provide deglitched clock signal CLK_IN' to PFD 320. Glitch cleaner may employ a DSP to monitor a bit stream for pulses and to reverse the logic level of a pulse if the duration of the pulse is shorter than a threshold duration. However, other digital and/or analog circuitry may be suitably employed. For example, digital and/or analog debounce circuit may be employed.

Turning to FIG. 4, input clock signal CLK_IN is derived from original clock signal CLK but may include jitter, glitches, and/or other noise. For example, periods $T_{JIT1}$ and $T_{JIT2}$ represent jitter between edges of original clock signal CLK and input clock signal CLK_IN. Also, the two $T_{GL}$ periods represent glitches. Lastly, duration $T_{THD}$ represents a threshold duration that is employed for the detection and removal of glitches. In one embodiment, duration $T_{THD}$ may be defined to be ½ or ¼th of an expected glitch free pulse width on input signal CLK_IN. However, duration $T_{THD}$ may be defined to be any suitable duration.

As can be seen, the $T_{GL}$ glitches are shorter than duration $T_{THD}$. Thus, glitch cleaner 310 detects these glitches and reverses the logic level of input clock signal CLK_IN during these glitches before providing deglitched clock signal CLK_IN'. Also, in deglitching input clock signal CLK_IN, deglitched clock signal CLK_IN' becomes delayed from input clock signal CLK_IN by duration $T_{THD}$. However, in some embodiments, an offset and/or adjustment signal (not shown) may be provided to PFD 320 and/or clock generator 350 to enable output clock signal CLK_OUT to be generated in-phase with input clock signal CLK_IN.

While the above description describes certain embodiments of the invention, and describes the best mode contemplated, no matter how detailed the above appears in text, the invention can be practiced in many ways. Details of the system may vary in implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

I claim:

1. A circuit for recovering a clock signal, comprising:
 a phase frequency detector that is configured to provide a phase error signal based, at least in part, on a difference between a first clock signal and a feedback signal;
 a loop filter that is configured to provide a filtered signal based, at least in part, on scaling the phase error signal by a first scaling factor and on filtering the scaled phase error signal;
 a compressor that is configured to provide a clock generator control signal based, at least in part, on scaling the filtered signal by a second scaling factor; and
 a clock generator that is configured to generate an output clock signal based, at least in part, on the clock generator control signal, wherein the feedback signal is based, at least in part, on the output clock signal,
 wherein the loop filter is further configured to scale the phase error signal by multiplying the phase error signal with the first scaling factor, wherein the compressor is further configured to scale the filtered signal by dividing the filtered signal by the second scaling factor, wherein the first scaling factor and the second scaling factor are positive integers, and wherein the first scaling factor is equal to the second scaling factor.

2. The circuit of claim 1, wherein the feedback signal is the output clock signal.

3. The circuit of claim 1, wherein the phase frequency detector, the loop filter, and the compressor are digital circuits.

4. The circuit of claim 1, wherein the clock generator includes at least one of a digital clock synthesizer, a voltage controlled oscillator, a current controlled oscillator, a crystal oscillator, a ring oscillator, a surface acoustic wave oscillator, or a Colpitts oscillator.

5. The circuit of claim 1, wherein the clock generator includes a digital clock synthesizer.

6. The circuit of claim 1, further comprising: a glitch cleaner circuit that is configured to receive an input clock signal and to provide the first clock signal to the phase error detector as a deglitched representation of the input clock signal.

7. The circuit of claim 1, wherein the phase frequency detector, the loop filter, the compressor, and the clock generator are configured as a phase lock loop (PLL) circuit; and wherein the clock generator control signal is representative of a frequency of the output clock signal.

8. The circuit of claim 1, wherein the first scaling factor is 32.

9. A method of recovering a clock signal, comprising:
 generating a phase error signal based, at least in part, on a difference between a first clock signal and a feedback signal;
 generating a filtered signal, including: scaling the phase error signal by a first scaling factor; and filtering the scaled phase error signal; generating a clock generator control signal by scaling the filtered signal by a second scaling factor; and
 generating an output clock signal based, at least in part, on the clock generator control signal, wherein the feedback signal is based, at least in part, on the output clock signal,
 wherein generating the filtered signal includes: employing an infinite impulse response filter to generate the filtered signal, and wherein the infinite impulse response filter has an associated transfer function of:

$$\frac{\beta}{1-\alpha Z^{-1}},$$

where $\beta$ is a first positive constant and $\alpha$ is a second positive constant;
 wherein the second scaling factor is an inverse of the first scaling factor, and wherein the first scaling factor is greater than the second scaling factor.

10. The method of claim 9, further comprising: providing the first clock signal as a deglitched representation of an input clock signal.

* * * * *